United States Patent [19]

Lin et al.

[11] Patent Number: 5,057,193
[45] Date of Patent: Oct. 15, 1991

[54] ANTI-TARNISH TREATMENT OF METAL FOIL

[75] Inventors: Lifun Lin, Hamden; Ned W. Polan, Madison, both of Conn.

[73] Assignee: Olin Corporation, Cheshire, Conn.

[21] Appl. No.: 453,370

[22] Filed: Dec. 22, 1989

Related U.S. Application Data

[63] Continuation of Ser. No. 333,210, Apr. 5, 1989, abandoned.

[51] Int. Cl.$^5$ .......................... C25D 5/48; C25D 7/06
[52] U.S. Cl. ........................................ 204/27; 204/28; 204/35.1
[58] Field of Search .................. 204/27, 28, 35.1, 38.1

[56] References Cited

U.S. PATENT DOCUMENTS

| | | | |
|---|---|---|---|
| Re. 30,180 | 12/1979 | Wolski et al. | 428/601 |
| 2,030,601 | 2/1936 | McDonald | 428/472.1 |
| 2,412,543 | 12/1943 | Tanner | 204/35.1 |
| 2,413,608 | 4/1947 | Thompson et al. | 428/472.1 |
| 2,647,865 | 8/1953 | Freud | 204/33 |
| 3,220,897 | 11/1965 | Conley et al. | 148/34 |
| 3,293,109 | 12/1966 | Luce et al. | 161/166 |
| 3,322,656 | 5/1967 | Dahringer et al. | 204/38 |
| 3,585,010 | 6/1971 | Luce et al. | 29/191.2 |
| 3,625,844 | 12/1971 | McKean | 204/140 |
| 3,677,828 | 7/1972 | Caule | 148/253 |
| 3,699,018 | 10/1972 | Carlson | 204/52 R |
| 3,716,427 | 2/1973 | Caule | 156/630 |
| 3,764,400 | 10/1973 | Caule | 148/258 |
| 3,853,716 | 12/1974 | Yates et al. | 204/28 |
| 3,857,681 | 12/1974 | Yates et al. | 29/195 |
| 3,918,926 | 11/1975 | Wolski et al. | 295/195 |
| 4,049,481 | 9/1977 | Morisaki | 156/151 |
| 4,053,370 | 10/1977 | Yamashita et al. | 204/13 |
| 4,131,517 | 12/1978 | Mitsuo et al. | 204/27 |
| 4,387,006 | 6/1983 | Kajiwara et al. | 204/32.1 |
| 4,432,846 | 2/1984 | Honeycutt, III | 204/129.95 |
| 4,468,293 | 8/1984 | Polan et al. | 204/27 |
| 4,515,671 | 5/1985 | Polan et al. | 204/228 |
| 4,529,486 | 7/1985 | Polan | 204/13 |
| 4,532,014 | 7/1985 | Polan et al. | 204/28 |
| 4,549,950 | 10/1985 | Polan et al. | 204/206 |
| 4,568,431 | 2/1986 | Polan et al. | 204/13 |
| 4,647,315 | 3/1987 | Parthasaranthi et al. | 148/258 |
| 4,652,346 | 3/1987 | Polan | 204/15 |
| 4,789,438 | 12/1988 | Polan | 204/13 |

FOREIGN PATENT DOCUMENTS

| | | |
|---|---|---|
| 112145 | 3/1975 | Fed. Rep. of Germany . |
| 1211494 | 11/1970 | United Kingdom . |
| 1293801 | 10/1972 | United Kingdom . |
| 2030176A | 4/1980 | United Kingdom . |
| 2073779A | 10/1981 | United Kingdom . |

OTHER PUBLICATIONS

U.S. Patent Application Ser. No. 07/333,212, filed Apr. 5, 1989-Lin et al., for "Treatment of Metal Foil".

*Primary Examiner*—T. M. Tufariello
*Attorney, Agent, or Firm*—H. Samuel Kieser

[57] ABSTRACT

A method of imparting tarnish and corrosion resistance to a copper or copper alloy foil in which the foil is first coated with a thin layer of zinc on at least one side. Thereafter, the foil is treated with an aqueous solution of chromic acid and sulfuric acid. The foil may then be rinsed in a dilute basic solution having a pH greater than 8 and then dried.

12 Claims, 1 Drawing Sheet

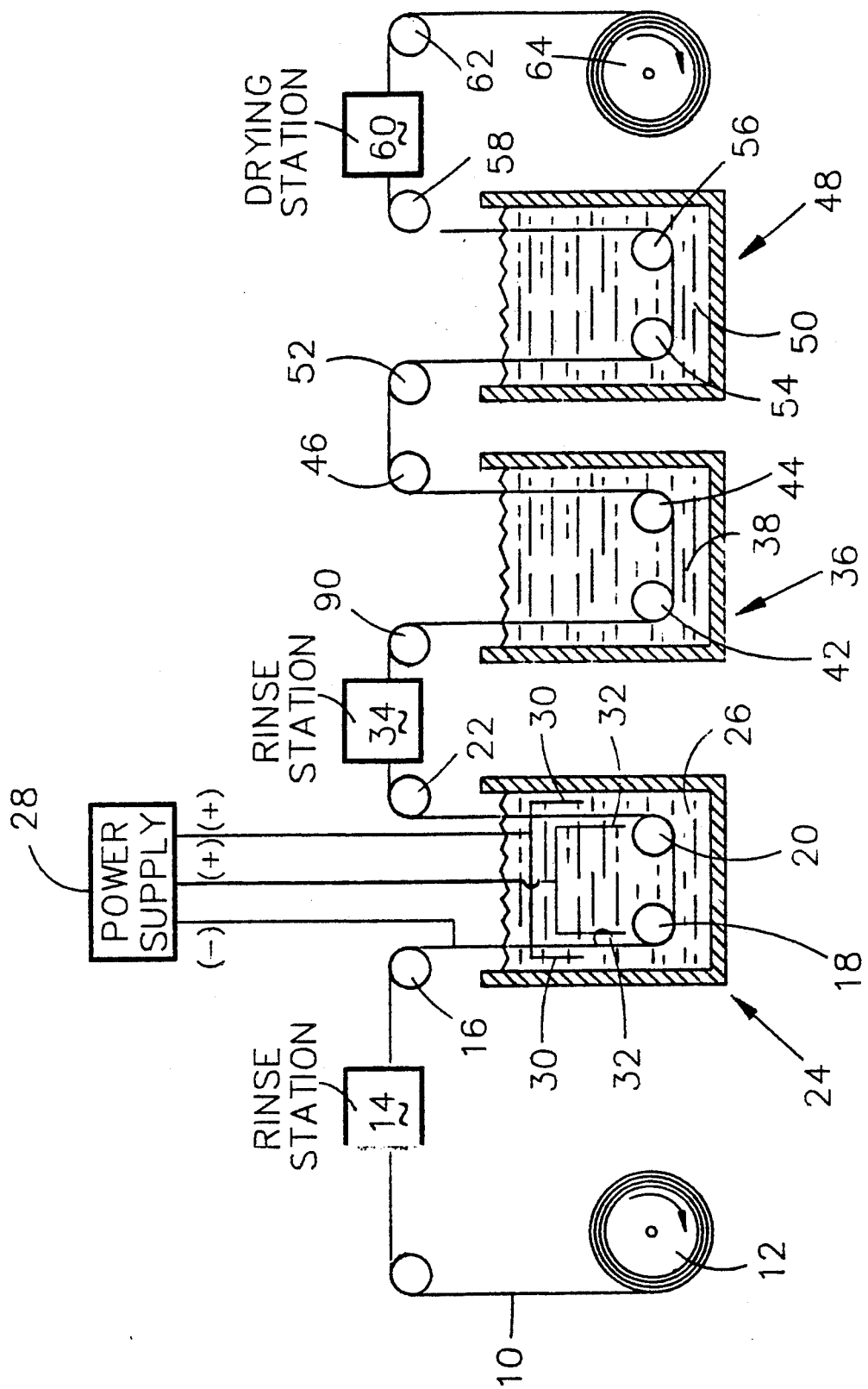

ANTI-TARNISH TREATMENT OF METAL FOIL

This application is a continuation of application Ser. No. 07/333,210 filed Apr. 5, 1989, now abandoned.

The present invention relates broadly to the treating of metal foil to form a tarnish and oxidation resistant film thereon. More specifically, the present invention relates to the treatment of copper and copper base alloy foil materials to prevent tarnishing.

One of the problems which faces manufacturers of both electrolytic and wrought copper and copper alloy materials is the tarnishing of the materials during storage and shipment. This tarnishing generally results from the exposure of the copper to normal atmospheric conditions. This tarnishing is aesthetically unpleasant as well as a potential source of serious problems during the manufacture of many products such as printed circuits. For example, tarnishing of copper foil prior to its lamination to a dielectric substrate can affect both the bond strength between the foil and the substrate material and the etching characteristics of the resultant laminate.

In the past, tarnish resistance has been imparted to copper and copper base alloy materials by immersion of the copper material in an electrolyte containing chromate ions U.S. Pat. No. 3,625,844 to McKean describes a method of antitarnishing copper foil involving the electrolytic treatment of copper foil in an aqueous electrolyte under critical conditions of hexavalent chromium ion concentration, cathode current density, and treatment time. U.S. Pat. No. 3,853,716 to Yates et al discusses the McKean process and points out that it is not a completely satisfactory antitarnishing technique because a build-up of copper and chromium cations in the electrolyte bath interfere with the effectiveness of the antitarnishing. Yates et al attempt to overcome this problem by rendering the copper material cathodic as it passes through an aqueous electrolyte containing hexavalent chromium ion-containing anions and being of sufficient alkalinity to cause precipitation of copper and chromium cations. U.S. Pat. Nos. 4,131,517 to Mitsuo et al and 4,387,006 to Kajiwara et al illustrate still other chromate containing treatments for suppressing time dependent changes in color tone during storage. Still other antitarnishing techniques are illustrated in U.K. published patent applications 2,030,176A and 2,073,779A.

Solutions of phosphoric acid, chromic acid and/or their salts have also been applied to various materials in an attempt to impart tarnish and corrosion resistance to the material. U.S. Pat. Nos. 3,677,828, 3,716,427 and 3,764,400, all to Caule, illustrate the use of phosphoric acid solutions to improve the tarnish resistance of copper and copper base alloys. Caule also describes in his '400 patent the use of a basic rinse solution after application of his phosphoric acid treatment. Phosphoric and/or chromic acid solutions have also been applied to zinc, zinc-coated articles, and aluminum foil and articles U.S. Pat. Nos. 2,030,601 to McDonald, 2,412,543 to Tanner, 2,418,608 to Thompson et al, 2,647,865 to Freud and 4,432,846 to Honeycutt III illustrate some of the applications of phosphoric-chromic acid solutions.

The treatment of copper or copper alloy foil for use in printed circuit applications creates a somewhat unique problem that limits the suitability of some antitarnishing treatments. In the manufacture of printed circuits, copper sheet or foil is bonded to a dielectric substrate. Prior to bonding, at least one surface of the copper foil is generally roughened or treated to improve the bond strength between the foil and the substrate. While there are a variety of techniques available to roughen or treat the foil surface, one of the most commonly used involves the formation of a plurality of copper or copper oxide modules or dendrites on the foil surface. U.S. Pat. Nos. 4,468,293 and 4,515,671 both to Polan et al illustrate one such dendritic or nodular roughening treatment.

The primary deficiency of many antitarnishing treatments is the concentration of chromic and/or phosphoric acid and/or their salts in the antitarnishing solution. Where the antitarnishing solution contains relatively high concentrations of chromic and/or phosphoric acid and/or their salts, immersion of the treated copper foil in the solution may lead to dissolution of the nodules or dendritic particles which may result in relatively weak bond strength characteristics.

Copper or copper alloy foil is used in many printed circuit board applications, particularly with fiberglass or epoxy substrates. Such foil may require an electrodeposited zinc or brass coating on at least one side of the foil, usually the roughened side of electrodeposited foil bearing the nodules or dendrites of the roughening treatment. The zinc or brass coating is needed in some instances to provide adequate bond strength with the substrate. After the zinc or brass coating, the foil may be further treated to impart tarnish resistance during storage and further processing by the circuit board laminators and manufacturers.

One such tarnish resistant treatment is described in U.S. Pat. No. 4,647,315 to Parthasarathi and Polan, which tends to overcome the problems mentioned above. Briefly, the process disclosed in that patent comprises the immersion of the copper or copper alloy foil in a dilute aqueous solution of a mixture of chromic acid and phosphoric acid followed by a rinse in a dilute basic solution having a pH greater than about 8.

It has been found that in using the process of the type described in U.S. Pat. No. 4,468,293 to provide a nodule or dendritic roughened surface followed by zinc coating on the roughened surface and immersion in a dilute chromate solution such as an aqueous solution of $CrO_3$ or $Na_2Cr_2O_7$ at room temperature, while the foil has a relatively good peel strength, the tarnish resistance imparted by such a process is not entirely satisfactory as it does not prevent oxidation in air at 175° C. for 30 minutes.

On the other hand, utilizing the antitarnish treatment of U.S. Pat. No. 4,647,315 on such foil by immersion in a chromic acid phosphoric acid solution followed by a $Ca(OH)_2$ rinse provides good tarnish resistance but results in relatively poor peel strength.

In accordance with the present invention, a technique is provided which results in both superior tarnish resistance and high peel strength for copper and copper alloy foil. According to the process of the present invention, a thin zinc coating is applied on the smooth or non-treated side of the foil followed by immersion in a chromic acid/sulfuric acid bath followed by a rinse in a dilute basic solution. As a result of this treatment, a thin zinc coating, from about 0.06 to 0.003 mg/cm$^2$ is provided on the smooth side.

Accordingly, it is an object of the present invention to provide a novel treatment useful in providing tarnish resistance to copper and copper base alloy materials.

It is a further object of the present invention to provide an antitarnish treatment for treating copper or copper alloy foil and rendering it more particularly suitable for use in printed circuit applications.

These and other objects of the present invention will become more apparent from the following description and to the accompanying drawings in which:

FIG. 1 is schematic representation of a system for treating foil in accordance with the present invention.

As previously noted, the present invention involves an improved technique for treating copper and copper alloy foil materials to improve tarnish resistance. As used herein, the term copper and copper alloy foil includes copper and copper base alloy sheet or strip foil and slab materials.

The particular process to be described herein is useful with electrodeposited or wrought foil and particularly useful for either types of foil which have one surface which has been provided with a dendritic or nodular roughening treatment such as described in U.S. Pat. No. 4,468,293.

In accordance with a preferred embodiment of the invention, the foil is electrodeposited foil of which one side (the outside surface) has been subjected to a dendritic or nodular roughening treatment of the type disclosed U.S. Pat. No. 4,468,293. After such dendritic or nodular surface treatment, the foil 10 may be immediately processed in accordance with the present invention, or the foil stored on a takeup roll 12 from which it may be fed to the treatment line.

The foil 10, whether electrodeposited or wrought, may be rinsed with deionized water at a rinse station 14 and then passed by means of a series of rolls 16, 18, 20 and 22 through a zinc plating treatment tank 24 containing an appropriate zinc plating solution 26 therein. This treatment may be used to apply a relatively heavy coating of zinc to the rough side of the foil 10 while a thin coating of zinc is applied to the smooth of the foil. The thin layer of zinc on the smooth side is in the order of from about 0.001 to about 0.06 mg/cm². The heavy coating of zinc may be between about 0.3 to about 3.0 g/m² and preferably between about 0.5 to about 2.0 g/m².

The zinc plating solution 26 comprises a suitable form of zinc, preferably in the form of zinc sulfate. The zinc sulfate is dissolved in water to form an aqueous solution of from about 0.1M to about 1.5M. The zinc deposit is greater on the roughened side of the foil as compared with the smooth side. This may be accomplished in a number of ways. One such way includes rendering cathodic by electrically connecting one or more rolls to the negative terminal of a suitable power supply 28. Two separate sets of anodes 30 and 32 may be used, one set 30 facing the smooth side of the foil and the second 32 facing the roughened or dendritic side of the foil. The anodes 30 and 32 are connected to positive terminals of the power supply 18 which provides the proper current density.

The current density applied to the front side of the foil may be between 5 to about 150 mA/cm² and preferably around 40 mA/cm² while the current density applied to the back or smooth side of the foil is from about .01 to about 100 mA/cm² and preferably around 5 mA/cm². To provide for the thicker layer on the roughened side as compared with the smooth side, in addition to using a higher current density, the length of time at which the front surface of the foil 10 may be subjected to the plating treatment may be longer than the back. This can be accomplished in a variety of ways, one of which is by having the length of the anodes 32 facing the roughened side longer than the anodes 30 on the smooth side. With the temperature of the plating solution in the range of about 35 to 40° C., the current density may be applied to the front side in the order of from about 2 to about 100 seconds and preferably 10 seconds while the current density may be applied to the back side in range from about 0.1 to about 100 seconds and preferably about 5 seconds.

After the zinc plating treatment, the foil 10 may pass through a rinse station 34 wherein it is rinsed in deionized water. The rinse station 34 may include a plurality of spray nozzles (not shown) arranged to spray deionized water on both sides of the foil 10. While such nozzles may be arranged in any suitable configuration and may have any desired nozzle pattern it is preferred that the nozzles be arranged in banks of adjacent square pattern nozzles on opposite sides of the foil 10. Alternatively, the rinse station 34 may comprise a tank containing the rinse solution and through which the foil is passed or a combination of sprays and immersion.

After the rinse station 34, the foil 10 is immersed in a tank 36 containing a chromic acid-sulfuric acid solution 38. The foil is passed through the tank 36 by means of suitable rolls 40, 42, 44 and 46. In accordance with the present invention, the solution 38 in the tank contains chromic acid in a concentration of about 0.02 grams per liter (hereinafter g/l) to about 1.0 g/l and sulfuric acid in the concentration in the range of about 0.02 g/l to about 20 g/l depending upon the temperature and length of time of treatment. Generally the solutions contain no other constituents besides water and some minor impurities. Preferably, the solution consists essentially of from about 0.1 g/l to about 0.3 g/l of chromic acid, from about 0.02 to about 0.7 g/l of sulfuric acid and the balance essentially water.

While the foil may be treated with the chromic acid-sulfuric acid solution at any desired temperature, it is preferred that the solution 28 in the tank be maintained at an elevated temperature in the range of 50° to 55° C. With this temperature and the concentrations of chromic acid being 0.2 g/l and the sulfuric acid being 0.05 g/l, the foil may be immersed in the solution for about 20 seconds.

It has been found that the use of sulfuric acid in this step enhances the reaction of the $Cr^{+6}$ with the metal surface and does not have a deleterious reaction with the zinc layer. If phosphoric acid is used in place of the sulfuric acid, although relatively good tarnish resistance is provided, the resulting foil has a relatively inferior peel strength believed to be caused by the chemical reaction of the zinc, sulfuric acid and calcium hydroxide used in the next step.

After treatment of the foil 10 with the chromic acid-sulfuric acid solution, the foil 10 may be further treated by immersion in a tank 48 containing a dilute basic solution 50 having a pH greater than about 8. A plurality of rolls 52, 54, 56 and 58 may be used to define the path by which the foil 10 passes through the tank.

Dilute basic solutions in accordance with the present invention comprise aqueous solutions having a pH of at least 8. Solutions of particular benefit are those having a pH in the range of about 9 to 11.5. Any suitable addition agent may be employed to adjust the pH of this solution. Generally, the addition will be selected from the group consisting of the salts of alkali metals, the salts of alkaline earth metals, the hydroxides of the alkali metals, and the hydroxides of the alkaline earth metals. A preferred addition agent is selected from a group consisting of sodium hydroxide, calcium hydroxide, potassium hydroxide and ammonium hydroxide. While the amount of addition agent present in the solution will be a function of the desired pH level for the solutions, generally the addition agent will be present in the concentration of greater than 1 ppm and preferably about 50 ppm.

The temperature of the basic solution may be maintained at a temperature in the range from room temperature to about 100° C. and preferably between about 45° to about 50° C. While the time of immersion of the foil in the basic solution may vary from about 1 second to about 120 seconds, most preferably it is immersed for about 5 seconds to about 30 seconds. It has been found that the use of the basic rinse solution after treatment with the chromic acid-sulfuric acid bath serves to enhance the anti-tarnish treatment.

After the foil 10 exits from the tank 48 containing the basic rinse solution, it passes through a drying station 60, positioned between the roll 58 and roll 62. Numerous drying processes which may be used are well known in the art. One such process which may be used embodies a water blow-off stage followed by a hot air tunnel drying stage. An alternative process which may be used utilizes heated blow-off air for both bulk and evaporative water removal. In this latter process, the hot air can be directed against the foil when it is lying on drum rolls in the line. In still another alternative process, at least one internally heated drum roll or infrared heating may be used to dry the foil. Any of these drying processes may be incorporated into the drying station 60. After the drying station 60, the foil may be wound onto a take up reel 64.

By virtue of the above described treatment, copper or copper alloy foil materials may be provided which possess good tarnish resistance and have good peel strength when bonded to a substrate material.

The U.S. Patents described in the specification are intended to be incorporated herein by reference in their entirety.

While the invention has been described above in connection with specific embodiments thereof, it is evident that many alternations, modifications, variations will be apparent to those skilled in the art in view of the foregoing description. Accordingly, it is intended to embrace all alternatives, modifications and variations as fall within the spirit and broad scope of the appended claims.

What is claimed is:

1. A process for imparting tarnish and oxidation resistance to copper and copper alloy foil material having one relatively roughened surface and one relatively smooth surface, said process comprising:
   applying a coating of zinc on the smooth side of the foil material, and thereafter.
   applying an aqueous sulfuric acid-chromic acid solution to said materials.

2. The process of claim 1 wherein said solution has a concentration of chromic acid in the range of about 0.1 g/1 to about 1.0 g/1 and a concentration of sulfuric acid in the range of about 0.02 g/1 to about 20 g/1.

3. The process of claim 2 wherein said concentration of said chromic acid is in the range of about 0.1 g/1 to about 0.3 g/1 and the concentration of said sulfuric acid is in the range of about 0.02 to about 0.7 g/1.

4. The process of claim 1 further comprising rinsing said material after applying said solution.

5. The process of claim 4 wherein said rinsing step comprises:
   applying an aqueous rinse solution having a pH greater than about 8 to said material.

6. The process of claim 5 further comprising:
   drying said material after said rinsing step.

7. The process of claim 5 wherein said rinsing solution contains at least 1 ppm of a material selected from the group consisting of the salts of alkali metals, the salts of alkaline earth metals, the hydroxides of the alkali metals, and the hydroxides of the alkaline earth metals.

8. The process of claim 7 wherein said rinse solution contains at least 1 ppm of a material selected from the group consisting of calcium hydroxides, sodium hydroxide, potassium hydroxide and ammonium hydroxide.

9. The process of claim 1 further comprising applying a coating of zinc on said roughened side of said material, said coating on said roughened side having a thickness greater than the coating on said relatively smooth side.

10. The process according to claim 1 wherein said coating of zinc on said relatively smooth side is from about 0.001 to about 0.06 mg/cm$^2$.

11. The process of claim 10 wherein a coating of zinc is applied to said roughened side, said coating on said roughened side being between about 0.3 to about 3.0 g/m$^2$.

12. The process of claim 11 wherein said coating of zinc on said roughened side is between about 0.5 to about 2.0 g/m$^2$.

* * * * *